United States Patent [19]

Cave et al.

[11] Patent Number: 5,104,745
[45] Date of Patent: Apr. 14, 1992

[54] MULTIFILAMENT SUPERCONDUCTOR STRAND HAVING AN ANTI-DIFFUSION BARRIER LAYER

[75] Inventors: Julian Cave, Paris; Thierry Verhaege, Saulx les Chartreux, both of France

[73] Assignee: GEC Alsthom SA, Paris, France

[21] Appl. No.: 549,197

[22] Filed: Jul. 6, 1990

[30] Foreign Application Priority Data

Jul. 6, 1989 [FR] France ............... 89 09120

[51] Int. Cl.$^5$ .......................... B21C 37/00
[52] U.S. Cl. ............... 428/607; 428/614; 428/662; 428/930; 174/125.1; 505/812
[58] Field of Search ........... 428/605, 606, 607, 614, 428/662, 930; 174/125.1; 505/806, 812, 813

[56] References Cited

U.S. PATENT DOCUMENTS 4,791,241 12/1988 Ando et al. ............... 179/125.1
4,917,965 4/1990 Inoue et al. ............... 505/813

OTHER PUBLICATIONS

Agatsuma, K., et al., IEEE Transactions on Magnetics, vol. Mag-19, No. 1, Jan. 1979.
IEEE Transactions on Magnetics, vol. 24, No. 2, Mar. 1988, New York, U.S., pp. 1033-1036; T. S. Kreilick et al.: "Influence of filament spacing and matrix material on the attainment of high quality uncoupled NbTi fine filaments."
IEEE Transactions on Magnetics, vol. 24, No. 2, Mar. 1988, New York, U.S. pp. 1145-1148; A. K. Ghosh et al.: "The effect of magnetic impurities and barriers on the magnetization and critical current of fine filament NbTi composites."

Primary Examiner—R. Dean
Assistant Examiner—George Wyszomierski
Attorney, Agent, or Firm—Sughrue, Mion, Zinn, Macpeak & Seas

[57] ABSTRACT

A multifilament superconducting strand for use at industrial frequencies and made from an initial billet comprising a superconducting core niobium-titanium alloy surrounded by an anti-diffusion barrier layer which is in turn surrounded by a copper based matrix material, with the strand being made from the billet by successive stages of extrusion, wire-drawing, and assembly, wherein the strand includes $5 \times 10^5$ to $5 \times 10^6$ filaments each constituted by the superconducting core reduced to a diameter in the range 50 nm to 150 nm, the filaments being separated from one another by a distance lying in the range 30 nm to 100 nm, which distance is occupied by the anti-diffusion layer and the matrix material. The matrix material contains in excess of 8% manganese when the anti-diffusion layer is made of niobium, or alternatively, the anti-diffusion layer may be of an iron-containing alloy with the matrix containing copper and nickel.

3 Claims, 1 Drawing Sheet

MULTIFILAMENT SUPERCONDUCTOR STRAND HAVING AN ANTI-DIFFUSION BARRIER LAYER

The present invention relates to a multifilament superconductor strand for use at industrial frequencies.

BACKGROUND OF THE INVENTION

A conductor is obtained by assembling together a large number of such strands. A strand is itself constituted by assembling a very large number of superconducting filaments which are separated from one another by a non-superconducting separation material.

It is known that superconducting filaments, in particular those of niobium-titanium, are capable of transporting very high current densities of about 10,000 $A/mm^2$, and that conductors based on such filaments are capable of having very low AC losses, under the following conditions:

1) The filaments must be ultrafine, having a diameter of less than 0.2 $\mu m$, and they must be continuous, i.e. of uniform section and without interruptions.

2) The filaments must be separated by a material capable of reducing proximity effects sufficiently which would otherwise give rise to supercurrents flowing between filaments.

3) The material separating the filaments should be highly resistive so as to limit induced current losses.

4) The filaments must be finely transposed.

A presently known way of making a multifilament superconducting strand starts from an initial billet constituted by a core made of an alloy of niobium and titanium disposed inside a matrix made of an alloy of copper and nickel, with a sheet of niobium being interposed between the core and the matrix and serving as a diffusion barrier to prevent matrix material diffusing into the superconducting core.

The strand is obtained by successive stages of extrusion, wire drawing, and assembling a multiplicity of cut-off lengths of the element as obtained after each wire-drawing operation.

With the materials currently used, it is observed that the spacing between two superconducting filaments in a completed strand must be greater than about 0.13 $\mu m$ in order to satisfy above-specified conditions 2 and 3. With increasingly fine superconducting filaments, this spacing requirement reduces the superconducting fraction and thus the apparent current density.

In practice, it becomes highly penalizing to reduce the diameter of the filaments below 0.15 $\mu m$, in spite of the considerable benefit that this would obtain with respect to losses and current density in the superconductor alone.

The object of the invention is to provide a super-conducting strand for use at industrial frequencies by using materials which simultaneously present metallurgical properties making them suitable for the manufacture of ultrafine filaments, and electrical properties enabling the spacing required between superconducting filaments to be considerably reduced, thereby making it possible to obtain a strand including an increased number of filaments at a smaller spacing, thus giving greatly increased apparent current densities which are multiplied by about two while losses are simultaneously divided by about two.

SUMMARY OF THE INVENTION

The present invention provides a multifilament superconducting strand for use at industrial frequencies and made frame an initial billet comprising a superconducting core of niobium or of a niobium alloy surrounded by at least one separation material, with the strand being made from said billet by successive stages of extrusion, wire-drawing, and assembly, wherein the strand includes $5 \cdot 10^5$ to $5 \cdot 10^6$ filaments each constituted by said superconducting core reduced to a diameter in the range 50 nm to 150 nm, the filaments being separated from one another by a distance in the range 30 nm to 100 nm, said distance being occupied by said separation material which includes not less than 8% manganese or iron.

In a particular embodiment, said separation material is a copper alloy including about 12% manganese and about 2% nickel.

An alloy of this type is known commerically under the name "manganin".

In another embodiment of the invention, said separation material is at least partially constituted by an austenitic steel which is not subject to martensitic transformation.

BRIEF DESCRIPTION OF THE DRAWING

An embodiment of the invention is described by way of example with reference to the accompanying drawing, in which.

DETAILED DESCRIPTION

Figure 1:
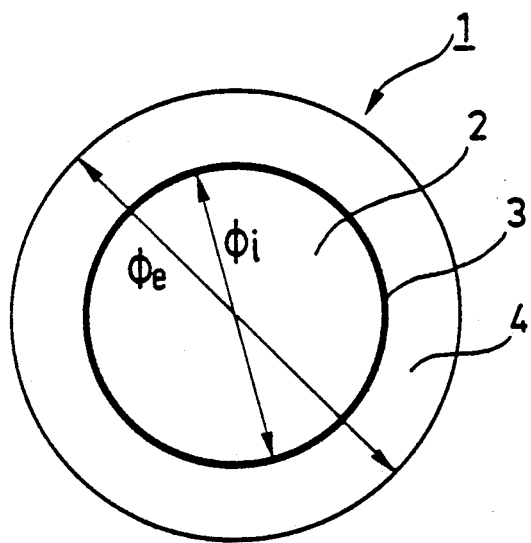
FIG. 1 is a section through an initial billet in a first embodiment of the invention for use with AC.

With reference to FIG. 1, an initial billet 1 can be seen comprisng a superconducting core 2 which may be made of niobium, or an alloy of niobium, e.g. an alloy of niobium and titanium.

This core is surrounded by two layers of separation material: the first layer 3 is made of niobium and constitutes a thin antidiffusion barrier; and the second layer 4 is a relatively thick layer of a copper-based alloy including at least 8% manganese. Good results have been obtained in tests performed using the product sold under the name "manganin" which is a copper alloy having 12% manganese and 2% nickel. The ratio of the outside diameter $\phi_e$ of the billet to the diameter $\phi_i$ of the core 2 is about 1.5, and the thickness of the layer 3 is negligible relative to the core 2 and the layer 4.

Figure 2:
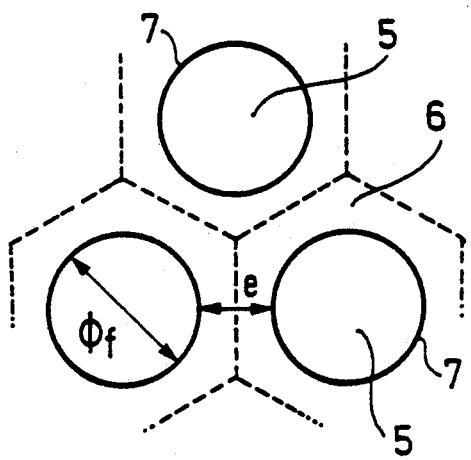
FIG. 2 is a fragmentary section through a very small part of the final superconducting strand made using the billet shown in FIG. 2.

The strand is made from this billet using the conventional method of extrusion and then wire-drawing, and FIG. 2 is a section through a fragment thereof. The resulting wire is then cut into lengths which are assembled in large numbers in a cupronickel sheath so as to begin the operation of extrusion and wire drawing over again. The final strand is thus obtained, for example, in three successive stages of extrusion and wire-drawing. The final strand has a diameter in the range 0.1 mm to 4 mm and has $5 \cdot 10^5$ to $5 \cdot 10^6$ superconducting filaments 5 which are constituted by the superconducting core 2 reduced to a diameter $\phi_f$ in the range 50 nm to 150 nm, with the filaments being separated from one another by a distance e in the range 30 nm to 100 nm. The separation material 6 is essentially constituted by the "manganin" of the layer 4 and each filament 5 is surrounded by a fine barrier layer 7 of niobium.

Such a strand gives good results when operating with AC. The looked-for quality for reducing proximity effects is the presence of materials having a high Bohr magneton, i.e. greater than four, and having magnetic spins which are disordered in order to avoid the hysteresis losses which would be induced by ferromagnetism if the spins were ordered. These magnetic spins reduce the coherenc length of the superconducting state in the layer 4 by magnetic diffusion.

In the context of utilization under slowly varying conditions, proposals have alreadly been made to add 0.1% to 4% manganese to the core of the outer layer 4 in order to reduce proximity effects on strands made up of filaments having a diameter of a few microns and at a spacing of about one micron. Under such conditions, the manganese content must be limited because of the increase in resistivity which is unfavorable for stability.

For strands that are to be used at industrial frequencies, stability is acquired by the very small size of the superconducting filaments and of the strands, and high resistivity is looked for in the outer separation layer 4. Much higher contents of manganese or of materials having comparable properties are then favorable both for increasing resistivity and for reducing proximity effects.

Figure 3:
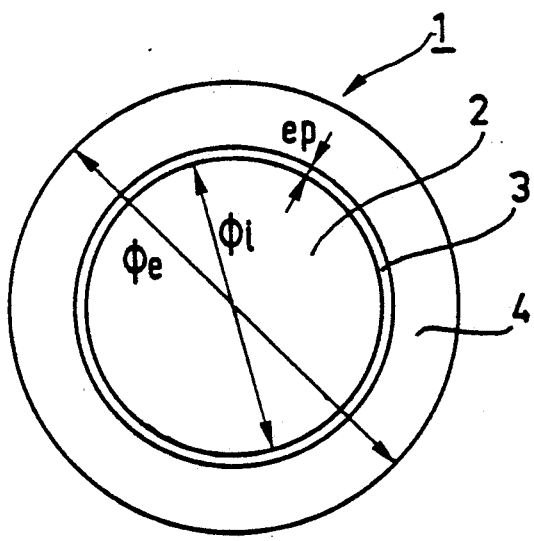
FIG. 3 is a section through an initial billet in a second embodiment of the invention.
Figure 4:
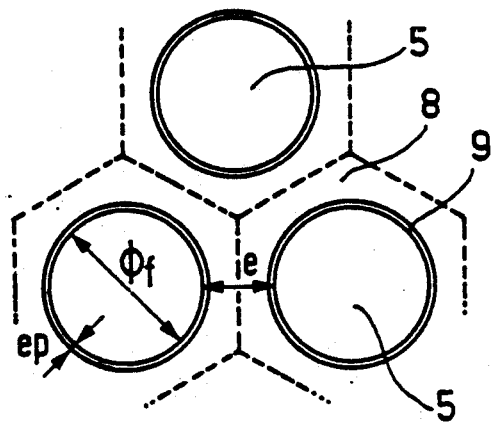
FIG. 4 is a fragmentary section through a very small part of a final superconducting strand made from the billet shown in FIG. 3.

FIGS. 3 and 4 show another embodiment in which the initial billet 1 has a superconducting core 2 of niobium-titanium surrounded by a first layer 3 of stable austenitic steel which is not subject to martensitic transformation while being subjected to work hardening during the wire-drawing stages. The following alloy may be used, for example: Fe-30% Ni-20% Cr-C-N.

This provides good ductility and no ferromagnetic losses. Resistivity is high. Tests have shown that such a material also constitutes an excellent diffusion barrier. The assembly is surrounded by a second layer 4 of cupronickel.

The ratio of the outside diameter $\phi_e$ of the billet 1 to the diameter $\phi_i$ of the core 2 is about 1.5, and the ratio of the thickness ep of the layer 3 to the diameter $\phi_i$ is about 0.05.

FIG. 4 is a fragmentary section through the final strand having a diameter in the range 0.1 mm and 0.4 mm, in which the filaments 5 have a diameter $\phi_f$ in the range 50 nm to 150 nm. The distance e between the filaments 5 lies in the range 30 nm to 100 nm and is made up of cupronickel 8 and austenitic steel 9 having a thickness ep of about 5 nm.

Naturally, the invention is not limited to the examples described above.

We claim:

1. A multifilament superconducting strand made from an initial billet comprising a superconducting core of niobium-titanium surrounded by an anti-diffusion barrier layer, said barrier layer surrounded by a copper-based matrix, with the strand having been made from said billet by successive stages of extrusion, wire-drawing, and assembly, wherein the strand includes $5 \times 10^5$ to $5 \times 10^6$ filaments, each filament being constituted by a conductive core of niobium-titanium having a diameter in the range of 50 nm to 150 nm, said anti-diffusion barrier layer comprising niobium with said matrix being a copper-nickel alloy including in excess of 8% manganese, or said anti-diffusion barrier layer comprising an alloy containing in excess of 8% iron with said matrix being a copper-nickel alloy, and wherein the filaments are separated from one another by a distance lying in the range of 30 nm to 100 nm.

2. A superconducting strand according to claim 1, wherein said anti-diffusion barrier layer comprises niobium and said copper based alloy contains approximately 12% manganese and 2% nickel.

3. A superconducting strand according to claim 1, wherein said anti-diffusion barrier layer is an austenitic steel containing Fe, approximately 30% Ni, approximately 20% Cr, and containing carbon and nitrogen.

* * * * *